(12) United States Patent
Kawai et al.

(10) Patent No.: US 8,842,203 B2
(45) Date of Patent: Sep. 23, 2014

(54) SOLID-STATE IMAGING DEVICE AND IMAGING APPARATUS

(71) Applicant: FUJIFILM Corporation, Tokyo (JP)

(72) Inventors: Tomoyuki Kawai, Saitama (JP); Seiji Tanaka, Saitama (JP); Tetsuro Ashida, Saitama (JP); Takehiro Kouguchi, Saitama (JP); Hisashi Endo, Saitama (JP); Tomoki Inoue, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/656,280

(22) Filed: Oct. 19, 2012

(65) Prior Publication Data

US 2013/0044244 A1 Feb. 21, 2013

Related U.S. Application Data

(63) Continuation of application No. PCT/JP2011/059432, filed on Apr. 15, 2011.

(30) Foreign Application Priority Data

Apr. 20, 2010 (JP) ................................. 2010-097368

(51) Int. Cl.

| | |
|---|---|
| *H04N 9/083* | (2006.01) |
| *H04N 9/68* | (2006.01) |
| *H04N 9/07* | (2006.01) |
| *H04N 9/04* | (2006.01) |
| *H04N 5/374* | (2011.01) |
| *H01L 27/146* | (2006.01) |

(52) U.S. Cl.
CPC .......... *H01L 27/14645* (2013.01); *H04N 9/045* (2013.01); *H04N 2209/045* (2013.01); *H04N 5/3742* (2013.01); *H01L 27/14621* (2013.01)
USPC ............ 348/280; 348/237; 348/266; 348/273

(58) Field of Classification Search
CPC ................. H04N 5/3742; H04N 9/045; H01L 27/14621; H01L 27/14645
USPC .......................... 348/237, 266, 273, 277, 280
See application file for complete search history.

(56) References Cited

U.S. PATENT DOCUMENTS 7,986,360 B2 * 7/2011 Mitsunaga et al. ........... 348/273
8,031,235 B2 * 10/2011 Wada ......................... 348/222.1

(Continued)

FOREIGN PATENT DOCUMENTS

| JP | 2001-267543 A | 9/2001 |
|---|---|---|
| JP | 2004-289728 A | 10/2004 |

(Continued)

OTHER PUBLICATIONS

A Japanese Office Action issued in corresponding Japanese Patent Application No. 2012-511643 on May 7, 2014, along with a partial English translation thereof.

*Primary Examiner* — Aung S Moe
*Assistant Examiner* — Amy Hsu
(74) *Attorney, Agent, or Firm* — Birch, Stewart, Kolasch & Birch, LLP

(57) ABSTRACT

A solid-state imaging device includes a plurality of pairs of a first photoelectric conversion element and a second photoelectric conversion element which have different spectral sensitivity characteristics. A wavelength range where the first photoelectric conversion element of each pair mainly has a spectral sensitivity and a wavelength range where the second photoelectric conversion element of each pair mainly has a spectral sensitivity respectively fall within a wavelength ranges of specific colors of visible light. The plurality of pairs include a plurality of types of pairs having different specific colors of visible light. The half width in the spectral sensitivity characteristic of the first photoelectric conversion element of the each pair is wider than a half width in the spectral sensitivity characteristic of the second photoelectric conversion element of the each corresponding pair.

10 Claims, 6 Drawing Sheets

(56) References Cited

U.S. PATENT DOCUMENTS

| | | | |
|---|---|---|---|
| 2004/0046883 A1* | 3/2004 | Suzuki | 348/315 |
| 2004/0189821 A1* | 9/2004 | Oda et al. | 348/223.1 |
| 2004/0201760 A1* | 10/2004 | Ota et al. | 348/272 |
| 2004/0262493 A1* | 12/2004 | Suzuki | 250/208.1 |
| 2009/0059051 A1* | 3/2009 | Sakamoto | 348/311 |

FOREIGN PATENT DOCUMENTS

| | | |
|---|---|---|
| JP | 2004-336469 A | 11/2004 |
| JP | 2006-135468 A | 5/2006 |
| JP | 2009-268078 A | 11/2009 |
| JP | 2009268078 A * | 11/2009 |

* cited by examiner

US 8,842,203 B2

SOLID-STATE IMAGING DEVICE AND IMAGING APPARATUS

CROSS REFERENCE TO RELATED APPLICATIONS

This application is a Continuation of PCT/JP2011/059432 filed on Apr. 15, 2011, which claims priority under U.S.C. 119(a) to Patent Application No. 2010-097368 filed in Japan on Apr. 20, 2010, all of which are hereby expressly incorporated by reference into the present application.

TECHNICAL FIELD

The present invention relates to a solid-state imaging device and an imaging apparatus.

BACKGROUND ART

Various arrays for a color filter array mounted on a solid-state imaging device have been proposed and used. For example, in an imaging apparatus described in Patent Document 1 indicated below, a color filter array called a Bayer array is used. In the Bayer array, color filters of any one of three primary colors of R (red), G (green) and B (blue) are arranged in a mosaic pattern. In the Bayer array, for example, a red pixel mounted with a red color filter cannot detect the green and blue signals. Therefore, a signal of a pixel mounted with a green color filter or a blue color filter and arranged around the red pixel is interpolated to acquire a green signal or a blue signal for the red pixel location.

In a solid-state imaging device described in Patent Document 2 indicated below, two pixels adjacent to each other in a slanted direction are grouped as a pair and color filters of any one of RGB are arranged in a unit of the paired pixels in a mosaic pattern. Therefore, for example, each pixel of the pair mounted with a green color filter is mounted with a G1 color filter or a G2 color filter.

In the relationship between the G1 and the G2, for example, the G1 and G2 are selected so that when the G1 and G2 are added, the G color is produced. A color filter of G color is manufactured to have a bell-shaped spectral characteristic having a width of about 100 nm in each of the forward and rearward directions for a center wavelength of 540 nm. On the other hand, for example, the G1 and G2 separate the bell-shaped spectral characteristic, such that the G1 color filter detects a color with a wavelength of 440 nm to 540 nm and G2 color filter detects a color with a wavelength of 540 nm to 640 nm. Similarly, for R color or B color, paired pixels are mounted with R1 and R2 color filters and B1 and B2 color filters, respectively.

In this manner, colors to be separated by color filters are more finely separated than three colors of RGB, such that the color reproducibility of the subject image can be improved.

In an imaging apparatus described in Patent document 3 indicated below, the respective pixels are divided into a large area part and a small area part. Furthermore, for example, in a pixel mounted with a green (G) filter, a filter thickness laminated on the small area part is thicker than that of the large area part or a thickness of n region constituting a photodiode is set to be thinner.

As a result, an incident light within a predetermined wavelength range substantially cannot be detected in the small area part while the light within the predetermined wavelength range can be detected in the large area part. By doing this, the imaging apparatus detects of whether there is light within the predetermined wavelength range or not to determine a type of light source.

PRIOR ART DOCUMENT

Patent Literature

[Patent Document 1] JP-2006-135468 A
[Patent Document 2] JP-2009-268078 A
[Patent Document 3] JP-2004-289728 A

SUMMARY OF THE INVENTION

Problems To Be Solved

In general, a conventional monitor device capable of displaying a color image was a CRT type monitor device, but recently, a liquid crystal display device has been widely popularized as an LCD TV. As a result, a normal user has been accustomed to a vivid color image of which the tone is different from a color image having a natural tone, and more frequently feels that there is something missing in a color image taken with a digital camera.

The color filter used in the conventional solid-state imaging device described above is merely a filter designed to color-reproduce an image of the subject in a natural tone. Therefore, it is unable to photograph the color image of the subject as a vivid color image.

In the meantime, there may be a scene in which color image of the subject is required to be photographed in a natural tone and thus, what is highly required is an imaging apparatus capable of photographing both of a color image with a vivid tone and a color image with a natural tone.

An object of the present invention is to provide a solid-state imaging device and an imaging apparatus capable of simultaneously imaging two types of color images with different natural tones (color reproducibilities).

Means for Solving the Problems

A solid-state imaging device of the present invention is a solid-state imaging device having a plurality of pairs of a first photoelectric conversion element and a second photoelectric conversion element each having a different spectral sensitivity characteristic, wherein a wavelength range that first photoelectric conversion element of each pair mainly has spectral sensitivity and a wavelength range that second photoelectric conversion element of each pair mainly has spectral sensitivity fall within the respective wavelength ranges of specific colors of visible light, the plurality of pairs include a plurality of types of pairs having different specific colors of visible light, the half width in the spectral sensitivity characteristic of the first photoelectric conversion element of the each pair is wider than a half width that in the spectral sensitivity characteristic of the second photoelectric conversion element of the each corresponding pair, the spectral sensitivity of the first photoelectric conversion element of the each pair at each wavelength that the first photoelectric conversion element of each pair mainly has spectral sensitivity is higher than the spectral sensitivity at each corresponding wavelength of the second photoelectric conversion element of the each corresponding pair, and (the half width in the spectral sensitivity characteristic of the first photoelectric conversion element of the each pair/the peak sensitivity of the spectral sensitivity of the first photoelectric conversion element of the each corresponding pair) is higher than (the half width in the spectral sensitivity characteristic of the second photoelectric conversion element of the each corresponding pair/the peak sensitivity of the spectral sensitivity of the second photoelectric conversion element of the each corresponding pair).

The imaging apparatus of the present invention includes a solid-state imaging device.

Effects of the Invention

According to the present invention, it is possible to provide a solid-state imaging device and an imaging apparatus capable of simultaneously obtaining two types of color image of which the natural tones are different from each other.

DESCRIPTION OF THE PREFERRED
EMBODIMENTS OF THE INVENTION

Hereinafter, embodiments of the present invention will be described with reference to the drawings.

Figure 1:
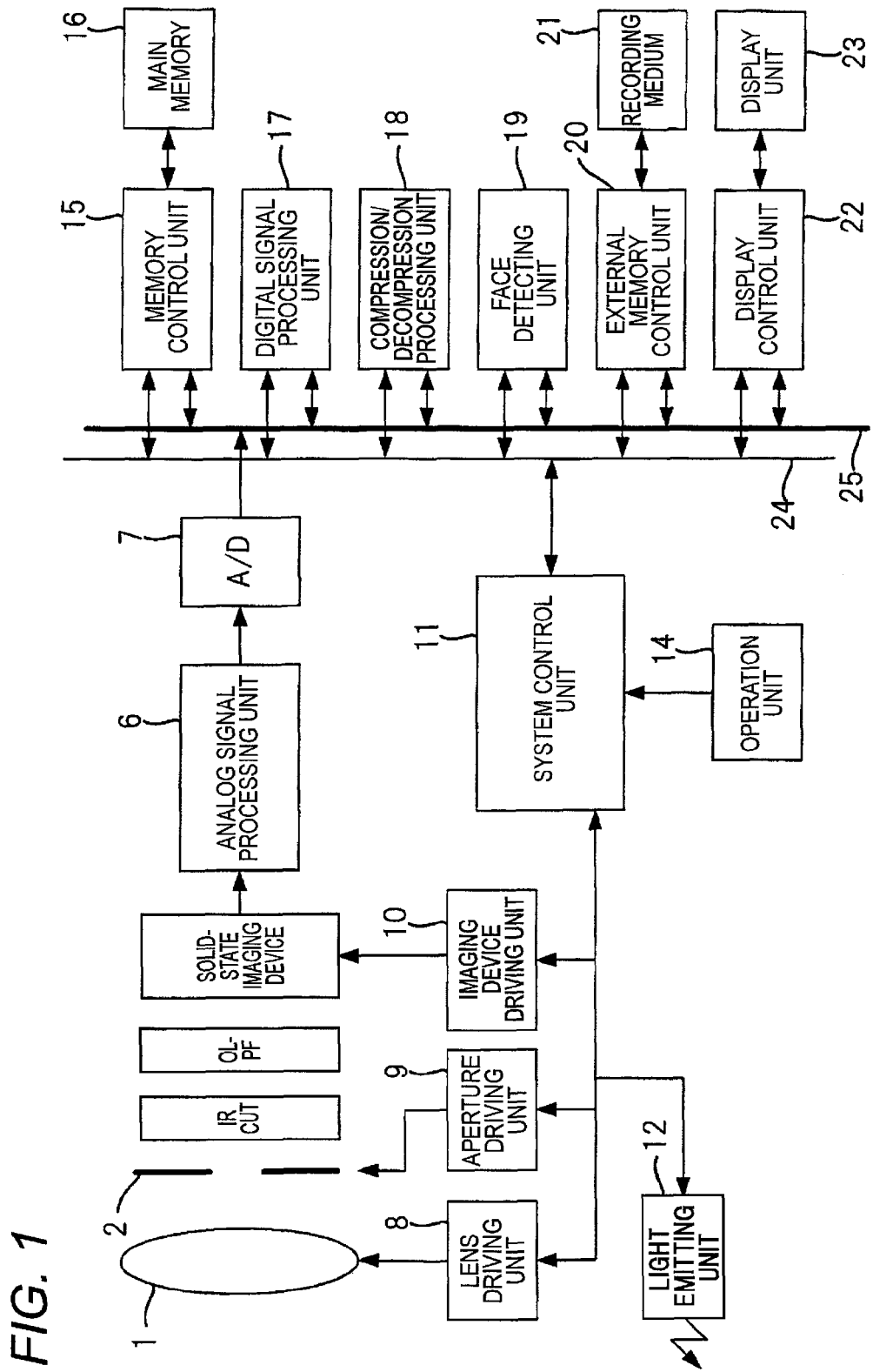
FIG. 1 is a view illustrating a schematic configuration of an imaging apparatus (digital camera) for describing an embodiment of the present invention.

FIG. 1 illustrates a schematic configuration of an imaging apparatus to describe an embodiment of the present invention. Examples of the imaging apparatus include imaging apparatuses such as digital cameras and digital televisions, imaging modules mounted on electronic endoscopes and a camera built-in mobile phone, and so on. Here, the digital camera will be described by way of an example.

An imaging system of the illustrated digital camera includes a photographing lens 1, a CCD type solid-state imaging device 5, and a diaphragm 2, an infrared cut filter 3, and an optical low pass filter 4 that are installed between the photographing lens 1 and the solid-state imaging device 5.

A system control unit 11 comprehensively managing and controlling an entire electrical control system of the digital camera controls a flash light-emitting unit 12. Further, the system control unit 11 controls a lens driving unit 8 to adjust a position of the photographing lens 1 to a focus position or to perform zoom adjustment. In addition, the system control unit 11 controls an aperture size of the diaphragm 2 via a diaphragm driving unit 9 to adjust an amount of light.

Further, the system control unit 11 drives the solid-state imaging device 5 via an imaging device driving unit 10, and outputs an image of a subject imaged through the photographing lens 1 as an imaging signal. An instruction signal is input into the system control unit 11 from a user via an operation unit 14.

The electrical control system of the digital camera further includes an analog signal processing unit 6 that is connected to an output of the solid-state imaging device 5 and performs analog signal processing such as correlated double sampling processing, and an analog/digital (A/D) conversion circuit 7 that converts RGB color signals output from the analog signal processing unit 6 into digital signals. The analog signal processing unit 6 and the A/D conversion circuit 7 are controlled by the system control unit 11.

Furthermore, the electrical control system of the digital camera includes: a main memory 16; a memory control unit 15 connected to the main memory 16; a digital signal processing unit 17 that performs an interpolation operation, a gamma correction operation, and an RGB/YC conversion processing to generate image data; a compression/decompression processing unit 18 that compresses the image data generated by the digital signal processing unit 17 in Joint Photographic Experts Group (JPEG) format and decompressing the compressed image data; a face detecting unit 19 that detects a face from the image data obtained by imaging the face with the solid-state imaging device 5 by a face recognition processing; an external memory control unit 20 to which a detachable recording medium 21 is connected; and a display control unit 22 to which a liquid crystal display unit 23 mounted on, for instance, the rear side of the camera is connected. The memory control unit 15, the digital signal processing unit 17, the compression/decompression processing unit 18, the face detecting unit 19, the external memory control unit 20, and the display control unit 22 are mutually connected by a control bus 24 and a data bus 25, and are controlled by commands from the system control unit 11.

Figure 2:
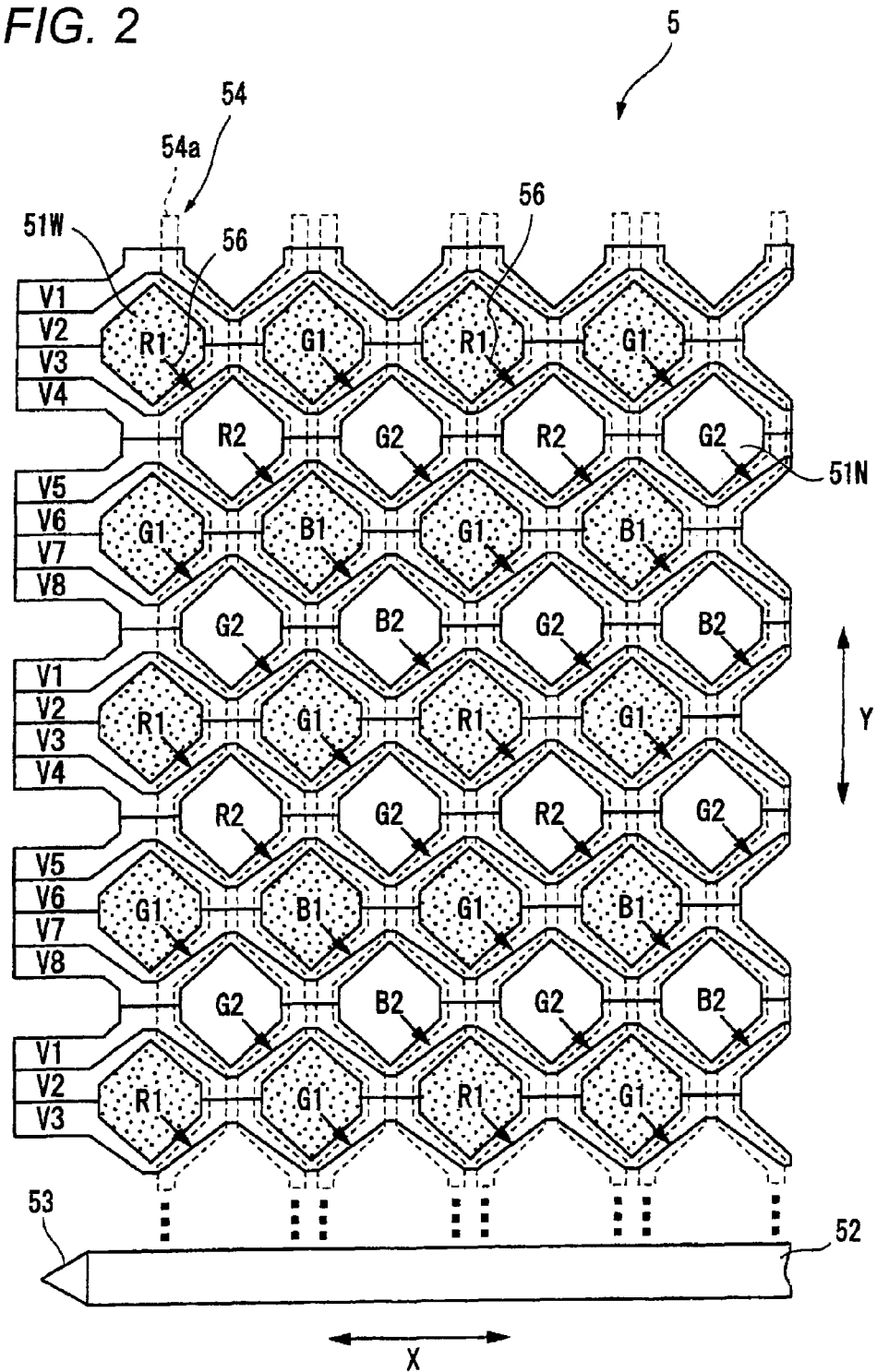
FIG. 2 is a plan view illustrating a schematic configuration of the digital camera shown in FIG. 1.

FIG. 2 is a plan view illustrating a schematic configuration of the solid-state imaging device 5 in the digital camera shown in FIG. 1.

As illustrated in FIG. 2, the solid-state imaging device 5 includes a first group made up of a plurality of photoelectric conversion elements 51W, a second group made up of a plurality of photoelectric conversion elements 51N, and a plurality of vertical charge transfer units 54, a horizontal charge transfer unit 52, and an output unit 53.

All the photoelectric conversion elements included in the solid-state imaging device 5 are disposed in a two-dimensional shape in a column direction Y of a semiconductor substrate surface and in a row direction X intersecting the column direction (crossing at right angles in an example of FIG. 2). All the photoelectric conversion elements have first photoelectric conversion element columns made up of the plurality of photoelectric conversion elements 51W arranged in parallel in the column direction Y, and second photoelectric conversion element columns made up of the plurality of photoelectric conversion elements 51N arranged in parallel in the column direction Y. Thus, the first photoelectric conversion element columns and the second photoelectric conversion element columns are arranged in parallel at a constant pitch in the row direction X. Furthermore, the first photoelectric conversion element columns are disposed to be shifted backward relative to the second photoelectric conversion element columns in the column direction Y by ½ of the array pitch of the photoelectric conversion elements of each photoelectric conversion element line in the column direction Y.

In this way, the photoelectric conversion elements 51N are disposed adjacent to the respective photoelectric conversion elements 51W in the same positional relationship (the same direction) with respect to the respective photoelectric conversion elements 51W. Thus, a pair is formed by each photoelectric conversion element 51W and the photoelectric conversion element 51N adjoining each photoelectric conversion element 51W in the same positional relationship.

All the photoelectric conversion elements included in the solid-state imaging device 5 have approximately the same configuration (the same design value). The term "approximately the same configuration" refers that photoelectric conversion regions (photodiodes) formed within a semiconductor substrate have approximately the same size, and that light-shielding films formed above the photoelectric conversion regions have approximately the same opening size.

In the solid-state imaging device 5, the photoelectric conversion element 51W and the photoelectric conversion element 51N constituting a pair meet the following conditions.

(1) The photoelectric conversion elements 51W and 51N have spectral sensitivity characteristics which are different from each other.

(2) A wavelength range where the photoelectric conversion element 51W mainly has a spectral sensitivity and a wavelength range where the photoelectric conversion element 51N mainly has spectral sensitivity (e.g., a half width in the spectral sensitivity characteristic of the photoelectric conversion elements 51N) fall within wavelength ranges of light of a specific color in visible light.

(3) The half width in the spectral sensitivity characteristic of the photoelectric conversion element 51N is narrower than that in the spectral sensitivity characteristic of the photoelectric conversion element 51W.

(4) A value of the spectral sensitivity at each wavelength of the wavelength range where the photoelectric conversion elements 51W mainly has the spectral sensitivity is greater than that at each corresponding wavelength of the photoelectric conversion elements 51N.

(5) A ratio of a peak value of the spectral sensitivity of the photoelectric conversion elements 51W to the half width in the spectral sensitivity characteristic of the photoelectric conversion elements 51W (half width/peak value) is greater than a ratio of a peak value of the spectral sensitivity of the photoelectric conversion elements 51N to the half width in the spectral sensitivity characteristic of the photoelectric conversion elements 51N (half width/peak value).

That is, in the photoelectric conversion elements 51W and 51N, there are characteristics in that a ratio of the half width of the photoelectric conversion element 51N to the half width of the photoelectric conversion element 51W (half width of the photoelectric conversion element 51W/half width of the photoelectric conversion element 51N) is greater than a ratio of peak sensitivity of photoelectric conversion element 51N to the peak sensitivity of the photoelectric conversion element 51W (peak sensitivity of photoelectric conversion element 51W/peak sensitivity of photoelectric conversion element 51N), and in that a decreasing rate of the sensitivity is smaller than that of the half width is appeared.

Further, the wavelength range where the photoelectric conversion elements mainly have the spectral sensitivity means that most of signals output from these photoelectric conversion elements are signals corresponding to light of this wavelength range, and indicates a range where signal components corresponding to light other than this wavelength range hardly exert an influence on colors of the signals output from these photoelectric conversion elements. Hereinafter, the half width in the spectral sensitivity characteristic of each photoelectric conversion element will be described as the wavelength range where each photoelectric conversion element mainly has the spectral sensitivity.

Several methods may be proposed as dose for differentiating the spectral sensitivity characteristics at the photoelectric conversion elements 51W and the photoelectric conversion elements 51N which form pairs. This solid-state imaging device 5 employs a method of differentiating the spectral sensitivity characteristics of the color filters installed above these elements.

Color filters R1 transmitting red light, color filters G1 transmitting green light, and color filters B1 transmitting blue light, which are disposed in a Bayer array as a whole, are installed above the respective photoelectric conversion elements 51W.

In FIG. 2, the letter "R1" is given to the photoelectric conversion elements 51W above which the color filters R1 are installed. Further, the letter "G1" is given to the photoelectric conversion elements 51W above which the color filters G1 are installed. In addition, the letter "B1" is given to the photoelectric conversion elements 51W above which the color filters B1 are installed.

Color filters R2 transmitting red light, color filters G2 transmitting green light, and color filters B2 transmitting blue light, which are disposed in a Bayer array as a whole, are installed above the respective photoelectric conversion elements 51N.

In FIG. 2, the letter "R2" is given to the photoelectric conversion elements 51N above which the color filters R2 are installed. Further, the letter "G2" is given to the photoelectric conversion elements 51N above which the color filters G2 are installed. In addition, the letter "B2" is given to the photoelectric conversion elements 51N above which the color filters B2 are installed.

In the following description, a color filter R1 and a color filter R2 are also collectively called a red filter; a color filter G1 and a color filter G2 are also collectively called a green filter; and a color filter B1 and a color filter B2 are also collectively called a blue filter.

In this way, the same color filters (the red filter, the green filter, or the blue filter) are disposed above each of the photoelectric conversion elements 51W and the photoelectric conversion elements 51N that form pairs. Accordingly, three types of pairs that are different in the color of the filter installed on the upper side (R pairs having the red filter thereabove, a G pair having the green filter thereabove, and a B pair having the blue filter thereabove) are included in the solid-state imaging device 5.

In addition, the specific color in the above condition (2) for each of the photoelectric conversion elements of the R pairs is red. The specific color in the above condition (2) for each of the photoelectric conversion elements of the G pair is green. In the above condition (2) for each of the photoelectric conversion elements of the B pairs, the specific color is blue.

In the respective photoelectric conversion elements of the R pairs, the respective spectral sensitivity characteristics of the color filters R1 and the color filters R2 are differentiated, so that there is provided a difference in the spectral sensitivity characteristic between the photoelectric conversion elements 51W and the photoelectric conversion elements 51N.

In each of the photoelectric conversion elements of the G pairs, the respective spectral sensitivity characteristics of the color filters G1 and the color filters G2 are differentiated, so that a difference in the spectral sensitivity characteristic is provided to the photoelectric conversion elements 51W and the photoelectric conversion elements 51N.

In the photoelectric conversion elements of the B pairs, the spectral sensitivity characteristics of the color filters B1 and the color filters B2 are differentiated, so that a difference in the spectral sensitivity characteristic is provided to the photoelectric conversion elements 51W and the photoelectric conversion elements 51N.

When the thicknesses of the color filters R1, R2, G1, G2, B1 and B2 are different from each other, the irregularities may be formed on a surface of the solid-state imaging device 5 and the process of laminating microlens thereon becomes complicated. Therefore, it is preferable to adopt the filters having the same thickness as described above in order to easily manufacture and reduce manufacturing cost.

Hereinafter, specific examples of the spectral sensitivity characteristic of each of the photoelectric conversion elements of the R pairs, the photoelectric conversion elements of the G pairs, and the photoelectric conversion elements of the B pairs will be described.

Figure 3:
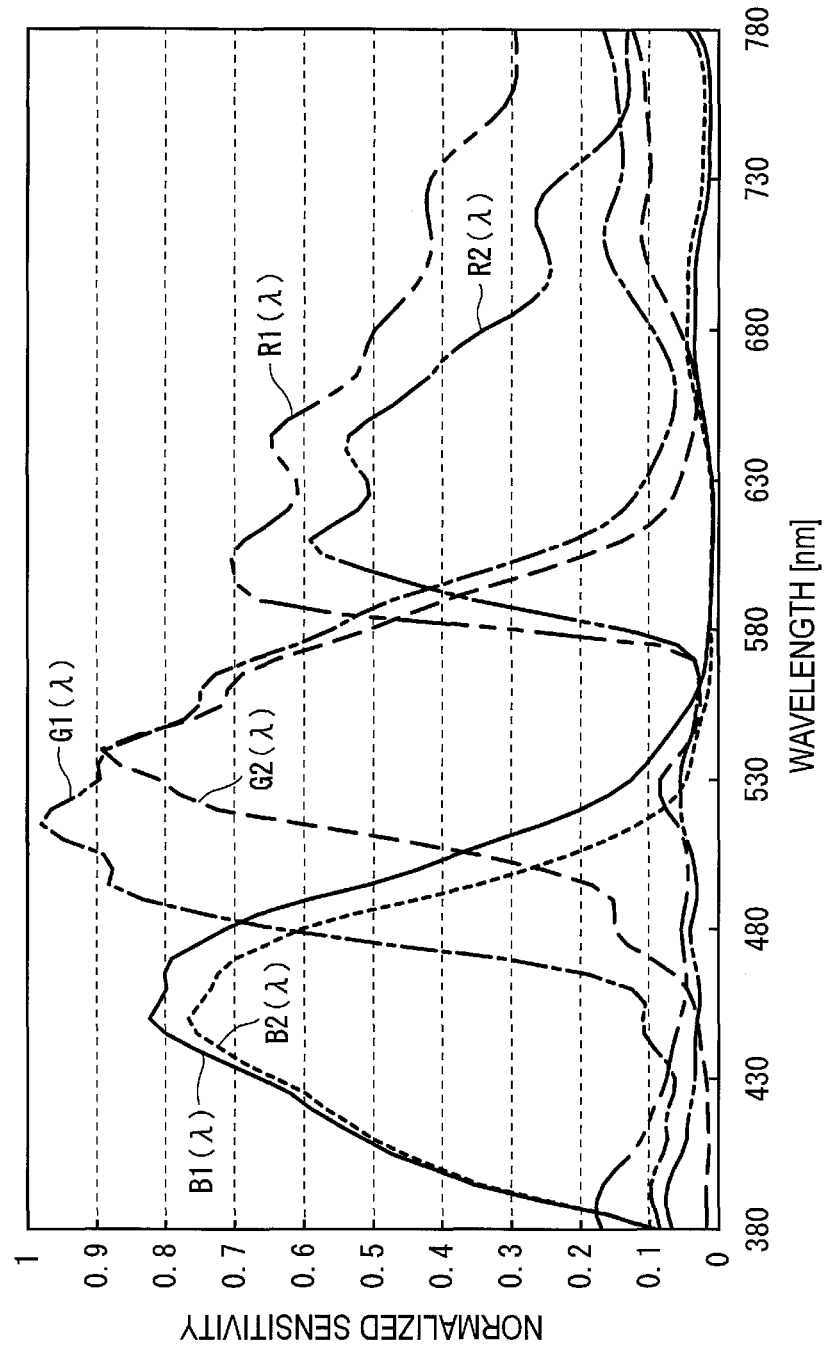
FIG. 3 is a view illustrating a spectral sensitivity characteristic of a photoelectric conversion element 51W and a photoelectric conversion element 51N in the solid-state imaging device shown in FIG. 2.

FIG. 3 is a diagram showing the spectral sensitivity characteristics of the photoelectric conversion element 51W and the photoelectric conversion element 51N in the solid-state imaging device 5 shown in FIG. 2.

In FIG. 3, the characteristics indicated by reference numerals $R1(\lambda)$, $G1(\lambda)$, $B1(\lambda)$ represent the spectral sensitivity characteristic of each photoelectric conversion element 51W on which the color filters R1, G1, B1 are installed, respectively.

Further, the characteristics indicated by reference numerals $R2(\lambda)$, $G2(\lambda)$, and $B2(\lambda)$ represent the spectral sensitivity characteristics of the photoelectric conversion element 51N on which the color filters R2, G2, and B2 are installed, respectively.

In addition, the light sensitivity characteristic illustrated in FIG. 3 is a light sensitivity characteristic when viewed the solid-state imaging device 5 alone and is not a light sensitivity characteristic when viewed the solid-state imaging device 5 with being mounted on the digital camera having an infrared cut filter 3.

In the example illustrated in FIG. 3, a wavelength corresponding to a peak sensitivity in the $R1(\lambda)$ is 605 nm and a wavelength corresponding to a peak sensitivity in the $R2(\lambda)$ is 610 nm. Further, a wavelength corresponding to a peak sensitivity in the $G1(\lambda)$ is 515 nm and a wavelength corresponding to a peak sensitivity in the $G2(\lambda)$ is 540 nm. A wavelength corresponding to a peak sensitivity in the $B1(\lambda)$ is 450 nm and a wavelength corresponding to a peak sensitivity in the $B2(\lambda)$ is 450 nm.

In the example illustrated in FIG. 3, the spectral sensitivity value in each wavelength of the wavelength range (half-value width) where the R pairs of photoelectric conversion elements 51W mainly have the spectral sensitivity is greater than that of each corresponding wavelength of the R pairs of photoelectric conversion elements 51N.

Furthermore, the half width in the spectral sensitivity characteristic $R2(\lambda)$ is narrower than that in the spectral sensitivity characteristic $R1(\lambda)$, and is located closer to the longer wavelength side in inner side of the half width in the spectral sensitivity characteristics $R1(\lambda)$. That is, a central point of the half width of the spectral sensitivity characteristic $R2(\lambda)$ is located closer to_the shorter wavelength side than a central point of the half width of the spectral sensitivity characteristic $R1(\lambda)$.

Further, the half width in the spectral sensitivity characteristic $R1(\lambda)$ is contained in the red wavelength range.

Further, a ratio of the peak value to the half width of the spectral sensitivity characteristic $R1(\lambda)$ is greater than a ratio of the peak value to the half width of the spectral sensitivity characteristic $R2(\lambda)$. Further, the locations of the shorter wavelength sides of the feet of the mountain-shaped waveforms in the spectral sensitivity characteristics $R1(?)$ and $R2(\lambda)$ are substantially matched with each other.

In addition, each half width in the spectral sensitivity characteristics $R1(\lambda)$ and $R2(\lambda)$ is a value in the wavelength range of 380 nm to 780 nm.

In the example shown in FIG. 3, the spectral sensitivity value in each wavelength of the wavelength range (half-value width) where the G pairs of photoelectric conversion elements 51W mainly have the spectral sensitivity becomes greater than that of each corresponding wavelength of the G pairs of photoelectric conversion elements 51N.

Further, the half width in the spectral sensitivity characteristic $G2(\lambda)$ is narrower than the half width in the spectral sensitivity characteristic $G1(\lambda)$, and is located closer to the longer wavelength side in inner side of the half width in the spectral sensitivity characteristics $G1(\lambda)$. That is, a central point of the half width of the spectral sensitivity characteristic $G2(\lambda)$ is located closer to the longer wavelength side than a central point of the half width of the spectral sensitivity characteristic $G1(\lambda)$.

Further, the half width in the spectral sensitivity characteristic $G1(\lambda)$ falls within the wavelength range of green. Further, a ratio of the peak value to the half width in the spectral sensitivity characteristic $G1(\lambda)$ is greater than a ratio of the peak value to the half width of the spectral sensitivity characteristic $G2(\lambda)$. Further, the locations of the shorter wavelength sides of the feet of the mountain-shaped waveforms in the spectral sensitivity characteristic $G1(\lambda)$ and $G2(\lambda)$ are substantially matched with each other.

In the example shown in FIG. 3, the spectral sensitivity value in each wavelength of the wavelength range (half-value width) that the B pair of photoelectric conversion elements 51W mainly have the spectral sensitivity is greater than the spectral sensitivity value in each corresponding wavelength of the B pair of photoelectric conversion elements 51N.

Further, the half width in the spectral sensitivity characteristic $B2(\lambda)$ is narrower than the half width in the spectral sensitivity characteristic $B1(\lambda)$, and is located closer to the shorter wavelength side in inner side of the half width in the spectral sensitivity characteristics $B1(\lambda)$. That is, a central point of the half width of the spectral sensitivity characteristic $B2(\lambda)$ is located closer to_the shorter wavelength side than a central point of the half width of the spectral sensitivity characteristic $B1(\lambda)$.

Further, the half width in the spectral sensitivity characteristic $B1(\lambda)$ falls within the wavelength range of blue. Further, a ratio of the peak value to the half width in the spectral sensitivity characteristic $B1(\lambda)$ is greater than a ratio of the peak value to the half width of the spectral sensitivity characteristic $B2(\lambda)$. Further, the locations of the shorter wavelength sides of the feet of the mountain-shaped waveforms in the spectral sensitivity characteristic $B1(\lambda)$ and $B2(\lambda)$ are substantially matched with each other.

In addition, the half width in each of the spectral sensitivity characteristics $B1(\lambda)$ and $B2(\lambda)$ is a value in the wavelength range of the visible light.

Further, "the feet of the mountain-shaped waveform" described above refers to, for example, a wavelength corresponding to one-tenth of peak value in a spectral sensitivity characteristic.

The conditions (1) to (5) can be met by providing the spectral sensitivity characteristics shown in FIG. 3 in this way.

The plurality of vertical charge transfer paths 54 are provided to correspond to the photoelectric conversion element columns one by one, and transfer a charge read from each photoelectric conversion element of the corresponding photoelectric conversion element columns in the column direction Y.

The vertical charge transfer units 54 are made up of charge transfer channels 54a formed within a semiconductor substrate, and transfer electrodes V1 to V8 arranged in parallel above the channels in the column direction Y. The transfer electrodes V1 to V8 are configured to be supplied with drive pulses from the imaging device driving unit 10 and the vertical charge transfer units 54 are driven by the drive pulses.

Charge read-out regions 56 (which are schematically depicted by an arrow in FIG. 2) are formed between the charge transfer channels 54a and the respective photoelectric conversion elements of the photoelectric conversion element columns corresponding to the channels.

The transfer electrodes V3 also cover the charge read-out regions 56 of the photoelectric conversion elements 51W of odd-number rows counting from an end portion (upper end portion) of the opposite side of the side at which the horizontal charge transfer unit 52 of the solid-state imaging device 5 is installed among the first group of photoelectric conversion elements 51W, and also serve as read-out electrodes for reading charges from these photoelectric conversion elements 51W.

The transfer electrodes V7 also cover the charge read-out regions 56 of the photoelectric conversion elements 51W of even-number rows counting from the upper end of the solid-state imaging device 5 among the first group of photoelectric conversion elements 51W, and also serve as read-out electrodes for reading charges from these photoelectric conversion elements 51W.

The transfer electrodes V5 also cover the charge read-out regions 56 of the photoelectric conversion elements 52N of odd-number rows counting from the upper end of the solid-state imaging device 5 among the second group of photoelectric conversion elements 52N, and also serve as read-out electrodes for reading charges from these photoelectric conversion elements 52N.

The transfer electrodes V1 also cover the charge read-out regions 56 of the photoelectric conversion elements 52N of even-number rows counting from the upper end of the solid-state imaging device 5 among the second group of photoelectric conversion elements 52N, and also serve as read-out electrodes for reading charges from these photoelectric conversion elements 52N.

The horizontal charge transfer unit 52 transfers the charges, which are transferred from the plurality of vertical charge transfer units 54, in the row direction X.

The output unit 53 converts the charges, which are transferred from the horizontal charge transfer unit 52, into signals corresponding to amounts of the charges, and output the signals.

The photoelectric conversion element 51W in a pair has a wide spectral sensitivity characteristic, of which the half width is wider than that of the corresponding photoelectric conversion element 51N of the pair. For this reason, a signal obtained from the first group of photoelectric conversion elements 51W may be, hereinafter, referred to as wide signals.

Further, the photoelectric conversion element 51N in a pair has a narrow spectral sensitivity characteristic, of which the half width is narrower than that of the corresponding photoelectric conversion element 51W of the pair. For this reason, the signals obtained from the second group of photoelectric conversion elements 51N may be, hereinafter, referred to as narrow signals.

The digital camera configured as described above has a two-image taking mode in which signals are read-out from all the photoelectric conversion elements included in the solid-state imaging device 5, one image data is generated from the narrow signals and one image data is generated from the wide signals, thereby recording each of the generated image data separately.

In the two-image taking mode, when the imaging command is issued, the imaging device driving unit 10 exposes the first group and the second group for the same exposure time and, after terminating the exposure, outputs the narrow signals and the wide signals from the solid-state imaging device 5.

The digital signal processing unit 17 processes the narrow signals to generate one image data (narrow image data) and processes the wide signals to generate one image data (wide image data). Each of the generated two image data is recorded separately in the recording medium 21.

As described above, according to the digital camera, since the solid-state imaging device 5 having the spectral characteristics represented in FIG. 3 is used, it is possible to obtain two image data, of which the tones (color reproducibilities) are different from each other, in the two-image taking mode.

In particular, since the solid-state imaging device 5 meets the condition (5) in addition to the conditions (1) to (4), either of the narrow image data and the wide image data may be an image data of RGB colors although they have different tones.

An example of the spectral sensitivity characteristic of the solid-state imaging device 5 capable of obtaining (satisfying the conditions (1) to (5)) the effect described above may be the example as illustrated in FIG. 4. The characteristics as illustrated in FIG. 4 meets a condition, in addition to the the conditions (1) to (5), that the locations of feet of the mountain-shaped waveform of the spectral sensitivity characteristics are almost identical to each other in the spectral sensitivity characteristics $R1(\lambda)$, $G1(\lambda)$ and $B1(\lambda)$ and the spectral sensitivity characteristics $R2(\lambda)$, $G2(\lambda)$ and $B2(\lambda)$.

Figure 4:
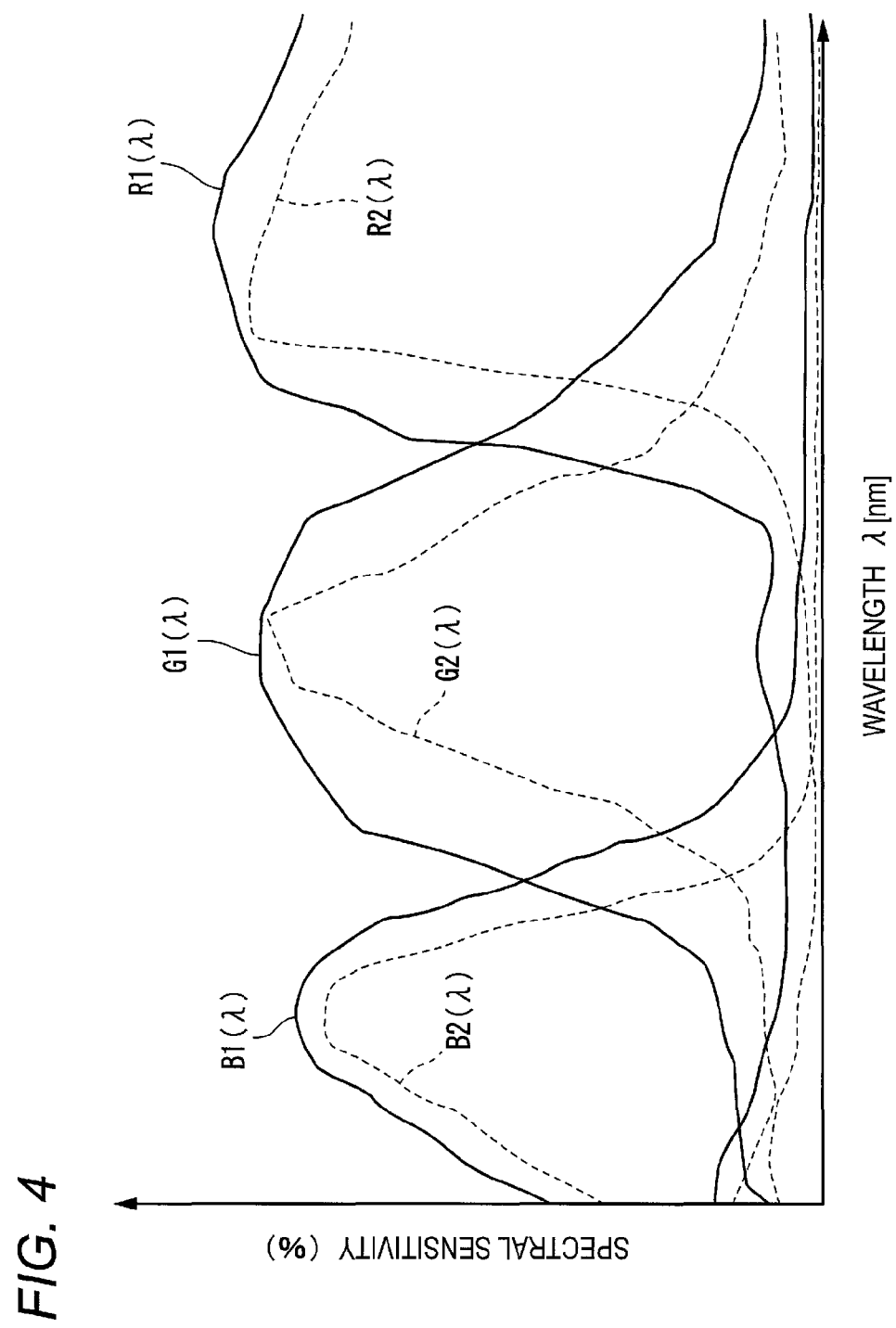
FIG. 4 is a view illustrating another example of the spectral sensitivity characteristic of a photoelectric conversion element 51W and a photoelectric conversion element 51N in the solid-state imaging device shown in FIG. 2.

According to the example illustrated in FIG. 4, the condition that the feet of the mountain-shaped waveforms of the spectral sensitivity characteristics are completely separated from each other in the spectral sensitivity characteristics $R1(\lambda)$, $G1(\lambda)$ and $B1(\lambda)$ and the spectral sensitivity characteristics $R2(\lambda)$, $G2(\lambda)$ and $B2(\lambda)$ (one is completely included in the other of the mountain-shaped waveforms of the spectral sensitivity characteristics) is satisfied. With satisfying the condition, the narrow image data can be made to be RGB color-intensified image data as compared to the wide image data. Also in the example illustrated in FIG. 3, since such conditions are satisfied in a wavelength range where each photoelectric conversion element mainly has the spectral sensitivity, it is possible to obtain the same effect.

According to the spectral sensitivity characteristics illustrated in FIG. 3, the half width of the spectral sensitivity characteristics $G2(\lambda)$ is located closer to the longer wavelength side in inner side of the half width of the spectral sensitivity characteristics $G1(\lambda)$. Accordingly, for example, when imaging a subject (for example, sea or sky) having a lot of wavelengths adjacent to 480 nm, the photoelectric conversion elements 51N, which are provided with the color filters G2 thereabove, do not substantially sensitive to light. Further, the photoelectric conversion elements 51W, which are provided with the color filters B1 thereabove, and the photoelectric conversion elements 51N, which are provided with the color filter B2 thereabove, become sensitive to light at the same level.

That is, even for the same subject, the wide signals contain more green components than the narrow signals. Therefore, when the image data is generated from the narrow signals, sea or sky is reproduced with a very dark (vivid) blue having a small amount of green component, and when the image data is generated from the wide signals, sea or sky is reproduced with a natural blue having a large amount of green component. As described above, the vivid image and the natural image can be obtained with a single imaging.

Further, in addition to satisfying the conditions (1) to (5), a characteristic, in which the mountain-shaped waveform of the spectral characteristic G2(λ) illustrated in FIG. 3 is slid to the shorter wavelength side so that the peak sensitivity of the spectral sensitivity characteristic G2(λ) is brought to a point of, for example, 500 nm (a characteristic in which the half width of the spectral sensitivity characteristic G2(λ) is located closer to the shorter wavelength side in inner side of the half width of the spectral sensitivity characteristics G1(λ)) may be adopted.

With such a configuration, for example, when a subject (for example, evening glow) having a lot of wavelengths adjacent to 580 nm is imaged, the evening glow is reproduced with a very dark red having a small amount of green component when the image data is generated from the narrow signals, and the evening glow is reproduced with a natural red having a large amount of green component when the image data is generated from the wide signals.

Therefore, as illustrated in FIG. 3, in order to obtain an image data having a different reproducibility, it is desirable to make the solid-state imaging device 5, in addition to satisfying the conditions (1) to (5), have a spectral sensitivity characteristic in which the half width of the spectral sensitivity characteristic G2(λ) is located closer to either the shorter wavelength side or the longer wavelength side in the inner side of the the half width of the spectral sensitivity characteristic G1(λ).

Further, in FIG. 3, in addition to satisfying the conditions (1) to (5), the half width of the spectral sensitivity characteristic B2(λ) may be located closer to the longer wavelength side in the inner side of the half width of the spectral sensitivity characteristic B1(λ), or a central point of the half width of the spectral sensitivity characteristic B2(λ) may be located at the same position of a central point of the half width in the spectral sensitivity characteristic B1(λ).

Further, in FIG. 3, in addition to the conditions (1) to (5), the half width of the spectral sensitivity characteristic R2(λ) may be located closer to the longer wavelength side in the inner side of the half width of the spectral sensitivity characteristic R1(λ), or the central point of the half width of the spectral sensitivity characteristic R2(λ) may be located at the same position of a central point of the half width of the spectral sensitivity characteristic R1(λ).

As illustrated in FIG. 3, the half width of the spectral sensitivity characteristic B2(λ) may be located closer to the shorter wavelength side in the inner side of the half width of the spectral sensitivity characteristic B1(λ), the image data generated from the narrow signal is reproduced as a RGB color-intensified image data. Due to this, the difference in tone may be more distinctively represented.

In FIG. 3, when it is configured such that the half width of the spectral sensitivity characteristic R2(λ) may be located closer to the longer wavelength side in the inner side of the half width of the spectral sensitivity characteristic R1(λ), the image data generated from the narrow signals is reproduced as a RGB color-intensified image data. Due to this, the difference in tone may be more distinctively represented.

In the solid-state imaging device 5, since the photoelectric conversion elements 51N of the second group are arranged adjacent to the photoelectric conversion element 51W of the first group in the same position relationship, it is possible to minimize a positional difference of the subject between an image data generated from the signals that can be obtained from the first group and an image data generated from the signals that can be obtained from the second.

That is, it is possible to obtain two image data each having a different color reproducibility in a single imaging without changing the resolution or location of the subject.

In particular, according to the digital camera using the solid-state imaging device 5 satisfying the conditions (1) to (5), for example, when a person is photographed, an image which reproduces the skin of the person naturally can be obtained with the wide image data having a high sensitivity and a low chroma. In the meantime, when a lake or forest is photographed, an image reproduced with vivid colors having a noticeable blue and green can be obtained with the wide image data having a slightly decreased sensitivity but correspondingly having an amount of chroma increased by a decreased amount of sensitivity. Like this, it is possible not only to record a preferable image in accordance with a scene but also to perform a two-image taking mode. Due to this, it is particularly useful for photographing a scene including subjects with different chromas, for example when photographing a person with a landscape, such as lake or green forest, for background.

As a method for differentiating spectral sensitivity characteristics in the photoelectric conversion elements 51W and the photoelectric conversion elements 51N, which form pairs, the following method may be employed.

That is, the spectral sensitivity characteristics of each of the color filters R1 and each of the color filters R2 are made to be equal to each other, the spectral sensitivity characteristics of each of the color filters G1 and each of the color filters G1 are made to be equal to each other, and the spectral sensitivity characteristics of each of the color filters B1 and each of the color filters B2 are made to be equal to each other. And, the structures of the photoelectric conversion elements 51W and the photoelectric conversion elements 51N of the pairs are made to be different from each other to differentiate the spectral sensitivity characteristics of the the photoelectric conversion elements 51W and the photoelectric conversion elements 51N.

For example, there is a method of changing, among the photoelectric conversion elements 51W, 51N that form a pair, the depth of a pn junction face of a photodiode of the photoelectric conversion elements 51W and that of a pn junction face of the photoelectric conversion element 51N.

The solid-state imaging device 5 is not limited to a CCD type solid-state imaging device, but may be a MOS type solid-state imaging device.

Figure 5:
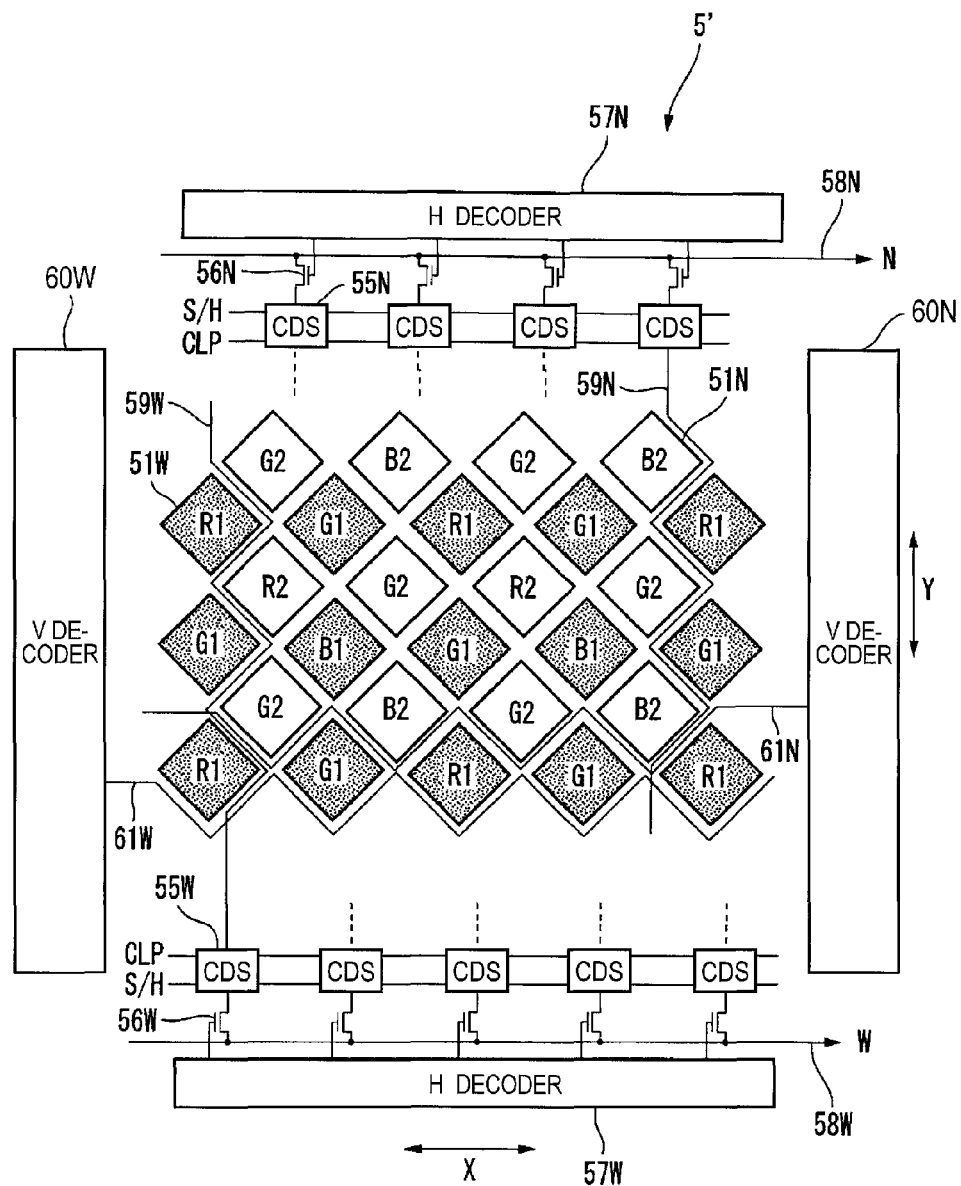
FIG. 5 is a view illustrating a configuration example when the solid-state imaging device shown in FIG. 2 is modified into a MOS type solid-state imaging device.

FIG. 5 is a schematic plan view illustrating a configuration example when the solid-state imaging device 5 illustrated in FIG. 1 is configured as a MOS type solid-state imaging device. In the solid-state imaging device 5' illustrated in FIG. 5, the array of the photoelectric conversion elements 51N and the photoelectric conversion elements 51W is the same as that illustrated in FIG. 2.

A MOS circuit, which is not illustrated, is provided correspondingly in the vicinity of each of all the photoelectric conversion elements included in the solid-state imaging device 5'. The MOS circuit is implemented with, for example, a well-known 3 transistor configuration.

The solid-state imaging device 5' includes a CDS circuit 55W, a transistor 56W, an H decoder 57W, a signal output line 58W, a wire 59 (a portion of which is illustrated), a V decoder 60W, and a wire 61W (a portion of which is illustrated), which are installed to correspond to the first group of the photoelectric conversion elements 51W.

The wire 61W is connected to the MOS circuits corresponding to a row of W photoelectric conversion elements constituted with a plurality of the photoelectric conversion elements 51W arranged in parallel in the row direction X, in which the wire 61W is connected to the V decoder 60W.

The V decoder 60W selects each of the rows of the W photoelectric conversion elements one by one, and performs a driving to read out signals to the wire 59W from the MOS circuits corresponding to the selected row of the photoelectric conversion elements.

The CDS circuit 55W is installed to correspond to a column of the W photoelectric conversion elements constituted with a plurality of the photoelectric conversion elements 51W arranged in parallel in a column direction Y, and are connected to the MOS circuits of the corresponding W photoelectric conversion elements' column through the wire 59W. The CDS circuit 55W performs a correlated double sampling of the input signal.

The H decoder 57W is connected to each of the CDS circuit 55W through the transistor 56W and turns ON the transistor 56W sequentially to output signals, after being processed in the CDS circuit 55W, to the signal output line 58W.

The solid-state imaging device 5' further includes a CDS circuit 55N, a transistor 56N, an H decoder 57N, a signal output line 58N, a wire 59N (a portion of which is illustrated), a V decoder 60N, and a wire 61N (a portion of which is illustrated), which are installed to correspond to the second group of the photoelectric conversion elements 51N.

The wire 61N is connected to the respective MOS circuits corresponding to a row of N photoelectric conversion elements constituted with a plurality of the photoelectric conversion elements 51N arranged in parallel in a row direction X, in which the wire 61N is connected to the V decoder 60N.

The V decoder 60N selects each of the rows of the N photoelectric conversion elements one by one, and performs a driving to read out signals to the wire 59N from the MOS circuit corresponding to the selected row of the photoelectric conversion elements.

The CDS circuit 55N is installed to correspond to a column of the N photoelectric conversion elements constituted with a plurality of the photoelectric conversion elements 51N arranged in parallel in a column direction Y, and is connected to the MOSs circuit of the corresponding N photoelectric conversion elements column through the wire 59N. The CDS circuit 55N performs a correlated double sampling of the input signal.

The H decoder 57N is connected to the CDS circuit 55N through the transistor 56N and turns ON the transistor 56N sequentially to output signals, after being processed in the CDS circuit 55N, to the signal output line 58N.

With adopting such a configuration, signals can be read out in parallel and concurrently in the first group and the second group.

In addition, herein, in the first group and the second group, the V decoder and the H decoder are separately provided, but the decoders may be formed as one decoder to form a general MOS sensor configuration.

Figure 6:
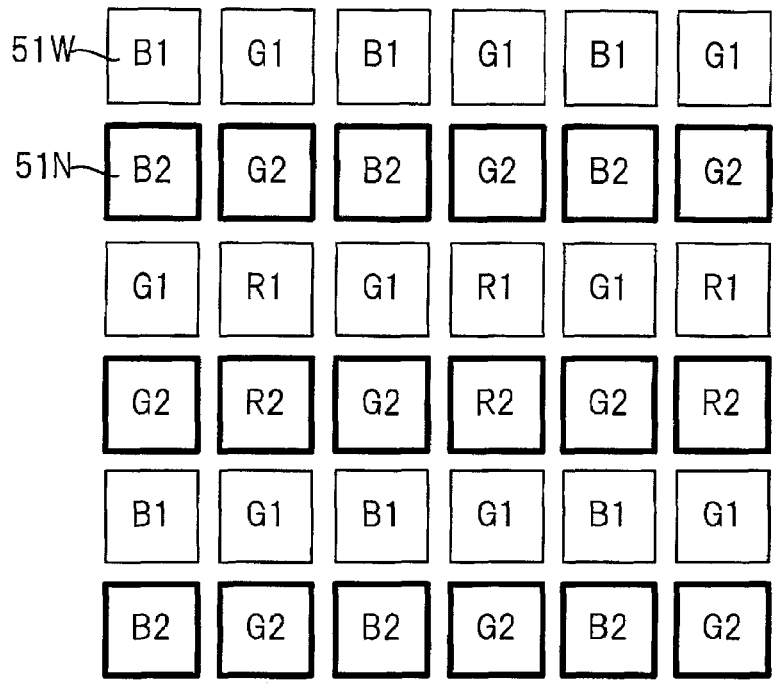
FIG. 6 is a modified example of an array of the photoelectric conversion elements of the solid-state imaging device shown in FIG. 2.
Figure 7:
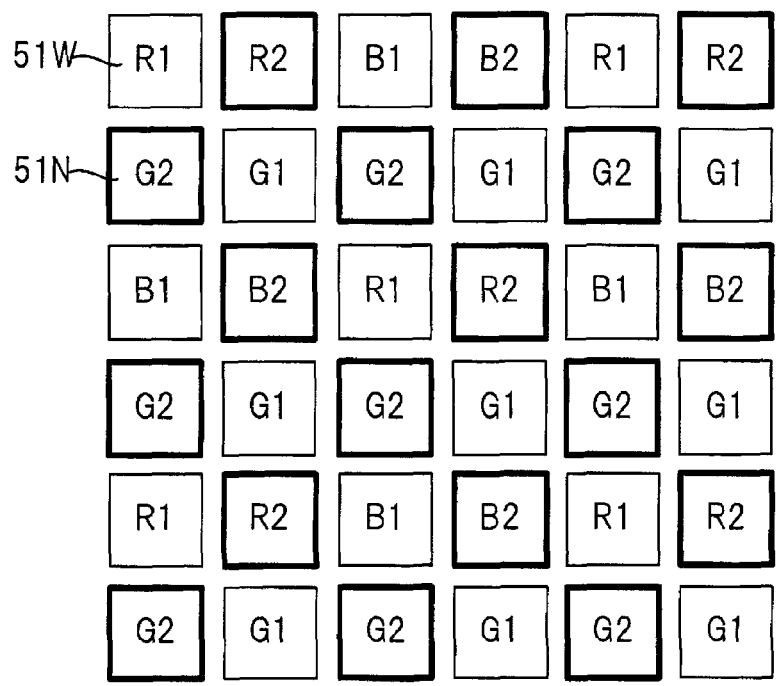
FIG. 7 is another modified example of an arrangement of the photoelectric conversion elements of the solid-state imaging device shown in FIG. 2.

The arrays of the respective photoelectric conversion elements 51W and 51N of the solid-state imaging devices 5', 5 illustrated in FIGS. 2 and 4 may be the same as those illustrated in FIGS. 6 and 7.

FIG. 6 is a view illustrating a modified example of the solid-state imaging device illustrated in FIG. 2. In the solid-state imaging device of the modified example, the plurality of the photoelectric conversion elements are arranged in a square lattice shape and odd number columns are formed as the photoelectric conversion elements 51W and even number columns are formed as the photoelectric conversion elements 51N.

FIG. 7 is a view illustrating another modified example of the solid-state imaging device illustrated in FIG. 2. The solid-state imaging device of the modified example is configured, such that the plurality of the photoelectric conversion elements are arranged in a square lattice shape and the photoelectric conversion elements 51W are arranged at positions of a checkered pattern and the photoelectric conversion elements 51N are arranged at positions of another checkered pattern.

Also, in the arrangements as illustrated in FIGS. 6 and 7, it is possible to differentiate the color reproducibilities in an image data that can be obtained from the first group and an image data that can be obtained from the second group.

In addition, in the description up to now, the solid-state imaging device 5 has three types of pairs and detects three primary colors of RGB with these three types of pairs, but is not limited thereto. For example, it may be configured such that complementary colors of cyan, magenta and yellow are detected with the three types of pairs. Further, the types of the pairs are not limited to the three types, and if there are at least two types of pairs, color imaging can be performed.

In the solid-state imaging devices illustrated in FIGS. 2 and 4, a control of changing the exposure time in the first group and the second group may be performed. For example, it is possible to achieve an expansion of dynamic range and the improvement of color reproducibility by combining two image data that can be obtained with changing the exposure time in the first group and the second group.

As having been described above, the following matters are disclosed in the present specification.

A disclosed solid-state imaging device is a solid-state imaging device having a plurality of pairs of a first photoelectric conversion element and a second photoelectric conversion element, which have different spectral sensitivity characteristics, wherein a wavelength range where the first photoelectric conversion element of each pair mainly has the spectral sensitivity and a wavelength range where second photoelectric conversion element of each pair mainly has the spectral sensitivity fall within the respective wavelength ranges of specific colors of visible light, the plurality of pairs include a plurality of types of pairs having different specific colors of visible light, the half width in the spectral sensitivity characteristic of the first photoelectric conversion element of the each pair is wider than a half width in the spectral sensitivity characteristic of the second photoelectric conversion element of the each corresponding pair, the spectral sensitivity of the first photoelectric conversion element of the each pair at each wavelength in the wavelength range where the first photoelectric conversion element of each pair mainly has spectral sensitivity is higher than the spectral sensitivity at each corresponding wavelength of the second photoelectric conversion element of the each corresponding pair, and (the half width in the spectral sensitivity characteristic of the first photoelectric conversion element of the each pair/the peak sensitivity of the spectral sensitivity of the first photoelectric conversion element of the each corresponding pair) is higher than (the half width in the spectral sensitivity characteristic of the second photoelectric conversion element of the each corresponding pair/the peak sensitivity of the spectral sensitivity of the second photoelectric conversion element of the each corresponding pair).

In the disclosed solid-state imaging device, the plurality of the pairs include three types of pairs formed with a blue pair, of which the specific color is blue, a green pair, of which the specific color is green, and a red pair, of which the specific color is red, and the half width in the spectral sensitivity characteristic of the second photoelectric conversion element of the green pair is located in the inside of the half width in the spectral sensitivity characteristic of the first photoelectric conversion element of the green pair and a center point of the half width in the spectral sensitivity characteristic of the second photoelectric conversion element of the green pair is located closer to the longer wavelength side than a center point of the half width in the spectral sensitivity characteristic of the first photoelectric conversion element of the green pair.

In the disclosed solid-state imaging device, the plurality of the pairs include three types of pairs formed with a blue pair, of which the specific color is blue, a green pair, of which the specific color is green, and a red pair, of which the specific color is red, and the half width in the spectral sensitivity characteristic of the second photoelectric conversion element of the green pair is located in the inside of the half width in the spectral sensitivity characteristic of the first photoelectric conversion element of the green pair and a center point of the half width in the spectral sensitivity characteristic of the second photoelectric conversion element of the green pair is located closer to the shorter wavelength side than a center point of the half width in the spectral sensitivity characteristic of the first photoelectric conversion element of the green pair.

In the disclosed solid-state imaging device, the plurality of the pairs include three types of pairs formed with a blue pair, of which the specific color is blue, a green pair, of which the specific color is green, and a red pair of which the specific color is red, and the half width in the spectral sensitivity characteristic of the second photoelectric conversion element of the blue pair is located in the inside of the half width in the spectral sensitivity characteristic of the first photoelectric conversion element of the blue pair and a center point of the half width in the spectral sensitivity characteristic of the second photoelectric conversion element of the blue pair is located closer to the shorter wavelength side than a center point of the half width in the spectral sensitivity characteristic of the first photoelectric conversion element of the blue pair.

In the disclosed solid-state imaging device, the plurality of the pairs include three types of pairs formed with a blue pair, of which the specific color is blue, a green pair, of which the specific color is green, and a red pair, of which the specific color is red, and the half width in the spectral sensitivity characteristic of the second photoelectric conversion element of the red pair is located in the inside of the half width in the spectral sensitivity characteristic of the first photoelectric conversion element of the red pair and a center point of the half width in the spectral sensitivity characteristic of the second photoelectric conversion element of the red pair is located closer to the longer wavelength side than a center point of the half width in the spectral sensitivity characteristic of the first photoelectric conversion element of the red pair.

In the disclosed solid-state imaging device, the solid-state imaging device further includes color filters, which are provided thereabove the first photoelectric conversion elements and the second photoelectric conversion elements, respectively, and a difference in spectral sensitivity characteristic between the first and second photoelectric conversion elements of each pair is obtained according to a difference in spectral sensitivity characteristic between the respective color filters provided above the first and second photoelectric conversion elements.

In the disclosed solid-state imaging device, the thickness of the color filters provided above the first photoelectric conversion devices is approximately the same as that of the color filters provided above the second photoelectric conversion devices.

In the disclosed solid-state imaging device, each of the first photoelectric conversion elements and each of the second photoelectric conversion elements are disposed such that a plurality of first photoelectric conversion element columns, in which the first photoelectric conversion elements are arranged in parallel in a column direction, and a plurality of second photoelectric conversion element columns, in which the second photoelectric conversion elements are arranged in parallel in the column direction, are alternately arranged in parallel in a row direction intersecting the column direction, the second photoelectric conversion element columns are arranged to be offset with respect to the first photoelectric conversion element columns in the column direction by a half of an array pitch in the column direction of the respective first photoelectric conversion elements and the second photoelectric conversion elements, and each of the first photoelectric conversion elements and the second photoelectric conversion element adjacent to the first photoelectric conversion element in the same positional relationship form each pair.

In the disclosed solid-state imaging device, all the first photoelectric conversion elements and the second photoelectric conversion elements included in the solid-state imaging device have approximately the same configuration.

The disclosed solid-state imaging device is equipped with the solid-state imaging devices.

INDUSTRIAL APPLICABILITY

According to the present invention, it is possible to provide a solid state imaging device capable of obtaining two types of the color images of which the colors are not unnatural and of which the tones are different from each other, and the imaging apparatus equipped with the solid state imaging device.

While the present invention has been described in detail or with reference to specific embodiments, it is apparent from those skilled in the art that various modifications or corrections can be made without departing from a spirit and scope of the present invention. This application claims priority to and the benefits of Japanese Patent Application No. 2010-97368 filed on Apr. 20, 2010, the disclosure of which is incorporated herein by reference.

DESCRIPTION OF REFERENCE NUMERALS 5 solid-state imaging device
10 imaging device driving unit
51W, 51N photoelectric conversion element

The invention claimed is:
1. A solid-state imaging device comprising:
a plurality of pairs of a first photoelectric conversion element and a second photoelectric conversion element which have different spectral sensitivity characteristics,
wherein a wavelength range where the first photoelectric conversion element of each pair mainly has a spectral sensitivity and a wavelength range where the second photoelectric conversion element of each pair mainly has a spectral sensitivity respectively fall within a wavelength ranges of specific colors of visible light,
the plurality of pairs include a plurality of types of pairs having different specific colors of visible light,
the half width in the spectral sensitivity characteristic of the first photoelectric conversion element of the each pair is wider than a half width in the spectral sensitivity char- acteristic of the second photoelectric conversion element of the each corresponding pair, the spectral sensitivity of the first photoelectric conversion element of the each pair at each wavelength in the wavelength range where the first photoelectric conversion element of each pair mainly has spectral sensitivity is higher than the spectral sensitivity at each corresponding wavelength of the second photoelectric conversion element of the each corresponding pair, and a ratio of a peak value of the spectral sensitivity of the first photoelectric conversion element of the each pair to the half width in the spectral sensitivity characteristic of the first photoelectric conversion element of the each corresponding pair is higher than a ratio of a peak value of the spectral sensitivity of the second photoelectric conversion element of the each pair to the half width in the spectral sensitivity characteristic of the second photoelectric conversion element of the each corresponding pair.

2. A solid-state imaging device according to claim 1, wherein the plurality of the pairs include three types of pairs formed with a blue pair of which the specific color is blue, a green pair of which the specific color is green, and a red pair of which the specific color is red, and the half width in the spectral sensitivity characteristic of the second photoelectric conversion element of the green pair is located in the inside of the half width in the spectral sensitivity characteristic of the first photoelectric conversion element of the green pair and a center point of the half width in the spectral sensitivity characteristic of the second photoelectric conversion element of the green pair is located closer to the longer wavelength side than a center point of the half width in the spectral sensitivity characteristic of the first photoelectric conversion element of the green pair.

3. A solid-state imaging device according to claim 1, wherein the plurality of the pairs include three types of pairs formed with a blue pair of which the specific color is blue, a green pair of which the specific color is green, and a red pair of which the specific color is red, and the half width in the spectral sensitivity characteristic of the second photoelectric conversion element of the green pair is located in the inside of the half width in the spectral sensitivity characteristic of the first photoelectric conversion element of the green pair and a center point of the half width in the spectral sensitivity characteristic of the second photoelectric conversion element of the green pair is located closer to the shorter wavelength side than a center point of the half width in the spectral sensitivity characteristic of the first photoelectric conversion element of the green pair.

4. A solid-state imaging device according to claim 1, wherein the plurality of the pairs include three types of pairs formed with a blue pair of which the specific color is blue, a green pair of which the specific color is green, and a red pair of which the specific color is red, and the half width in the spectral sensitivity characteristic of the second photoelectric conversion element of the blue pair is located in the inside of the half width in the spectral sensitivity characteristic of the first photoelectric conversion element of the blue pair and a center point of the half width in the spectral sensitivity characteristic of the second photoelectric conversion element of the blue pair is located closer to the shorter wavelength side than a center point of the half width in the spectral sensitivity characteristic of the first photoelectric conversion element of the blue pair.

5. A solid-state imaging device according to claim 1, wherein the plurality of the pairs include three types of pairs formed with a blue pair of which the specific color is blue, a green pair of which the specific color is green, and a red pair of which the specific color is red, and the half width in the spectral sensitivity characteristic of the second photoelectric conversion element of the red pair is located in the inside of the half width in the spectral sensitivity characteristic of the first photoelectric conversion element of the red pair and a center point of the half width in the spectral sensitivity characteristic of the second photoelectric conversion element of the red pair is located closer to the longer wavelength side than a center point of the half width in the spectral sensitivity characteristic of the first photoelectric conversion element of the red pair.

6. A solid-state imaging device according to claim 1, further comprising color filters which are provided above the first photoelectric conversion elements and the second photoelectric conversion elements, respectively, wherein a difference in spectral sensitivity characteristics between the first and second photoelectric conversion elements of each pair is obtained according to a difference in spectral sensitivity characteristics between the respective color filters provided above the first and second photoelectric conversion elements.

7. A solid-state imaging device according to claim 6, wherein the thickness of the color filters provided above the first photoelectric conversion devices is approximately the same as that of the color filter provided above the second photoelectric conversion devices.

8. A solid-state imaging device according to claim 1, wherein each of the first photoelectric conversion elements and each of the second photoelectric conversion elements are disposed such that a plurality of first photoelectric conversion element columns in which the first photoelectric conversion elements are arranged in parallel in a column direction and a plurality of second photoelectric conversion element columns in which the second photoelectric conversion elements are arranged in parallel in the column direction are alternately arranged in parallel in a row direction intersecting the column direction, the second photoelectric conversion element columns are arranged to be offset with respect to the first photoelectric conversion element columns in the column direction by a half of an array pitch in the column direction of the respective first photoelectric conversion elements and the second photoelectric conversion elements, and each of the first photoelectric conversion elements and the second photoelectric conversion element adjacent to the first photoelectric conversion elements in the same positional relationship form each pair.

9. A solid-state imaging device according to claim 1, wherein all the first photoelectric conversion elements and the second photoelectric conversion elements included in the solid-state imaging device have approximately the same configuration.

10. An imaging apparatus comprising the solid-state imaging device according to claim 1.

* * * * *